United States Patent
Zhong et al.

(10) Patent No.: US 7,223,695 B2
(45) Date of Patent: May 29, 2007

(54) METHODS TO DEPOSIT METAL ALLOY BARRIER LAYERS

(75) Inventors: Ting Zhong, Tigard, OR (US); Fay Hua, San Jose, CA (US); Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 10/957,117

(22) Filed: Sep. 30, 2004

(65) Prior Publication Data

US 2006/0071340 A1 Apr. 6, 2006

(51) Int. Cl.
*H01L 21/44* (2006.01)
(52) U.S. Cl. .................... 438/687; 438/648
(58) Field of Classification Search ............... 257/762; 438/687, 648, 656, 683, 685
See application file for complete search history.

(56) References Cited

U.S. PATENT DOCUMENTS

| | | | |
|---|---|---|---|
| 5,130,779 A * | 7/1992 | Agarwala et al. ........... 257/772 |
| 5,234,153 A | 8/1993 | Bacon et al. |
| 5,242,658 A | 9/1993 | Stevens et al. |
| 5,256,370 A | 10/1993 | Slattery et al. |
| 5,429,689 A | 7/1995 | Shangguan et al. |
| 5,449,955 A * | 9/1995 | Debiec et al. ............... 257/751 |
| 5,658,528 A | 8/1997 | Ninomiya et al. |
| 5,695,810 A | 12/1997 | Dubin et al. |
| 5,891,513 A | 4/1999 | Dubin et al. |
| 5,985,212 A | 11/1999 | Hwang et al. |
| 6,048,445 A | 4/2000 | Brain |
| 6,146,702 A | 11/2000 | Zitko |
| 6,359,328 B1 | 3/2002 | Dubin |
| 6,495,397 B2 | 12/2002 | Kubota et al. |
| 6,521,176 B2 | 2/2003 | Kitajima et al. |
| 6,555,052 B2 | 4/2003 | Soga et al. |
| 6,638,564 B2 | 10/2003 | Segawa et al. |
| 6,689,680 B2 | 2/2004 | Greer |
| 6,696,758 B2 | 2/2004 | Dubin et al. |

(Continued)

FOREIGN PATENT DOCUMENTS

EP 0 359 228 A2 3/1990

(Continued)

OTHER PUBLICATIONS

Suganuma, K. et al.; Microstructure and Strength of Interface Between Sn-Ag Eutectic Solder and CU; J. Japan. Inst. Metals C59 (1995), 1299-1305, p. 1 of 1 (*Abstract*).

(Continued)

*Primary Examiner*—Roy Karl Potter
(74) *Attorney, Agent, or Firm*—Blakely, Sokoloff, Taylor & Zafman LLP

(57) ABSTRACT

Metal alloy barrier layers formed of a group VIII metal alloyed with boron (B) and/or phosphorous (P) and an at least one element from glyoxylic acid, such as carbon (C), hydrogen (H), or carbon and hydrogen (CH) formed by electroless plating are described. These barrier layers may be used as a barrier layer over copper bumps that are soldered to a tin-based solder in a die package. Such barrier layers may also be used as barrier layer liners within trenches in which copper interconnects or vias are formed and as capping layers over copper interconnects or vias to prevent the electromigration of copper.

43 Claims, 8 Drawing Sheets

U.S. PATENT DOCUMENTS

| | | |
|---|---|---|
| 6,750,133 B2 | 6/2004 | Datta |
| 2003/0007886 A1 | 1/2003 | Hwa et al. |
| 2003/0060041 A1 | 3/2003 | Datta et al. |
| 2003/0143104 A1 | 7/2003 | Kitajima et al. |
| 2004/0164421 A1 | 8/2004 | Tellkamp |
| 2004/0253803 A1 | 12/2004 | Tomono et al. |
| 2005/0085062 A1* | 4/2005 | Kim .......................... 438/614 |

FOREIGN PATENT DOCUMENTS

| | | |
|---|---|---|
| EP | 0 710 521 A1 | 5/1996 |
| EP | 1 163 971 A1 | 12/2001 |
| JP | 62-287081 | 12/1987 |
| JP | 63-161174 | 4/1988 |

OTHER PUBLICATIONS

Kang, Sung K. et al.; Formation of $Ag_3Sn$ Plates in Sn-Ag-Cu Alloys and Optimization of Their Alloy Composition; pp. 1-8, Samsung Advanced Institute of Technology, Suwon, Korea.

Salam, B. et al.; Study of the Interface Microstructure of Sn-Ag-Cu Lead-Free Solders and the Effect of Solder Volume on Intermetallic Layer Formation; *IEEE 2001 Electronic Components and Technology Conference*, 0-7803-7038-Apr. 1, 2001.

Patent Abstracts of Japan, Publication No. 2000195885, Jul. 14, 2000, Applicant: Fujitsu Ltd.

Patent Abstracts of Japan, Publication No. 10314980, Dec. 2, 1998, Applicant: Sony Corporation.

Kwang-Lung Lin, et al.; The Interdiffusion and the Feasibility of Al/Mo/Ni/(Pb-Sn) as a Solder Bump System,; *Thin Solid Films*, Feb. 28, 1997, pp. 218-223, vol. 295, No. 1-2, Elsevier-Sequoia S.A., Lausanne, Switzerland.

Kwang-Lung Line, et al.; Material Interactions of Solder Bumps Produced with Fluxless Wave Soldering, *IEEE Transactions on Components*, Packaging, and Manufacturing Technology—Part B, Feb. 1998, pp. 59-64, vol. 21, No. 1.

Ken'lchi Mizuishi, et al.; Thermal Stability of Various Ball-Limited-Metal Systems Under Solder Bumps, *IEEE Transactions on Components*, Hybrids, and Manufacturing Technology, Dec. 1998, pp. 481-484, vol. 11, No. 4.

Y. Koyama, et al.; The Simple Hexagonal to B-Sn Martensitic Transisiton in Sn-(7.0-9.5) at % in Alloys, *Acta metal.*, vol. 37, pp. 597-602, 1989.

Rikiya Kato; Lead Free Copper-Indium-Bismuth-Tin Alloy Solder; Senju Metal Industry Co., Ltd.,Jpn. Kokai Tokkyo Koho,(1998), 4pp., p. 1 of 1 (*Abstract*).

Takeda, Naoko, eta l.; Lead-Free Tin Alloy Solders for Printed Circuit Board Showing Excellent Melting Property, Wettability and Mechanical Strength, Sony Corp., Japan, Jpn, Kokai Tokkyo Koho, 6pp., p. 1 of 1 (*Abstract*).

Domi, Shjinjiro, eta l.; Lead-Free Solder of Tin-Aluminum-Indium-Silver Alloy, Nippon Sheet Glass Co., Ltd., Jpn. Kokai Tokkyo Koho, 5 pp., 101 (*Abstract*).

\* cited by examiner

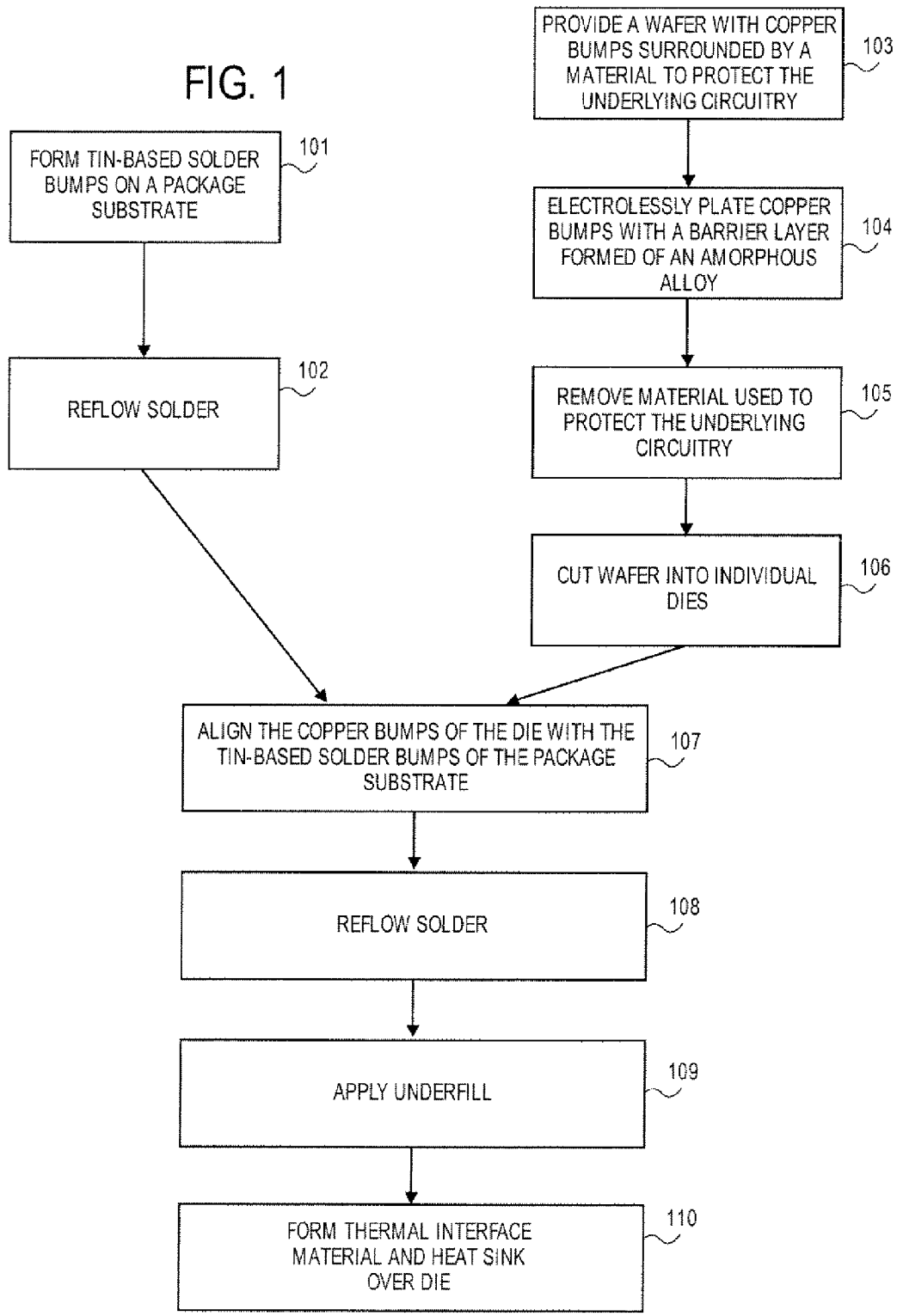

METHODS TO DEPOSIT METAL ALLOY BARRIER LAYERS

BACKGROUND OF THE INVENTION

1. Field of the Invention

The present invention relates to the field of semiconductor fabrication and processing and more particularly to the field of the electroless deposition of metal alloy barrier layers over copper.

2. Discussion of Related Art

Copper presents different engineering challenges during different stages of the semiconductor fabrication process. One such challenge is the formation of copper and tin intermetallic compounds on the interface between copper bumps on a die and the tin-based solder used to electrically connect that die to a substrate package, such as a ball grid array (BGA) or pin grid array (PGA), in a flip-chip process. The flip-chip process is a method to electrically connect the die to the package carrier. The package carrier, either a substrate or a leadframe, then provides the connection from the die to the exterior of the package. The interconnection between the die and the carrier in flip chip packaging is made through a conductive "bump" that is placed directly on the die surface. That bump may be formed of copper. The bumped die is then flipped over and aligned with tin-based solder bumps formed on the package carrier. The copper bumped die is attached to the package carrier through a metallic bond formed between the copper bumps on the die and the tin-based solder bumps on the package carrier. This metallic bond is formed by reflowing the tin-based solder to attach the solder to the copper bumps on the die. The direct contact of the copper of the copper bumps with the tin-based solder causes the diffusion of the copper from the copper bumps and the tin from the solder to form copper-tin intermetallic compounds. The diffusion of the copper and of the tin creates voids within the connection between the die and the package carrier. The voids cause shorts, excessive heat, and eventually failure of the device. Cobalt based barrier layers, such as CoBP and CoP, have been formed over the copper bumps to prevent the diffusion of the copper and tin and thus the formation of the intermetallic compounds. But, these barrier layers do not effectively block the diffusion of copper and tin. These refractory metal based barrier layers also became very brittle under the stresses placed on the package during fabrication and during the use of the device. Once the barrier layer material becomes brittle and breaks apart, there is further free diffusion of copper and tin through the cracks in the barrier layer and the formation of intermetallic compounds.

Another challenge of copper is the electromigration of copper from the interconnect lines and the vias of an integrated circuit into the surrounding dielectric material, particularly when the surrounding dielectric material is a porous low-k dielectric material. The diffusion of copper often requires the use of a diffusion barrier encapsulating or capping the copper interconnects or vias. A variety of materials are known for forming diffusion barriers on copper. Such materials include CoBP or CoWP alloys. However, these materials may be oxidized, removed, or corroded during the etching or cleaning of vias or trenches. Also, copper may migrate through the cobalt containing materials into the surrounding dielectrics causing shorts, or oxygen may migrate into the copper through the cobalt based material causing oxidation of the copper interconnects.

BRIEF DESCRIPTION OF THE DRAWINGS

FIG. 1 is a flow chart of an exemplary flip chip packaging method incorporating the formation of an metal alloy barrier layer of an embodiment of the present invention.

DETAILED DESCRIPTION OF THE PRESENT INVENTION

Figure 2A:
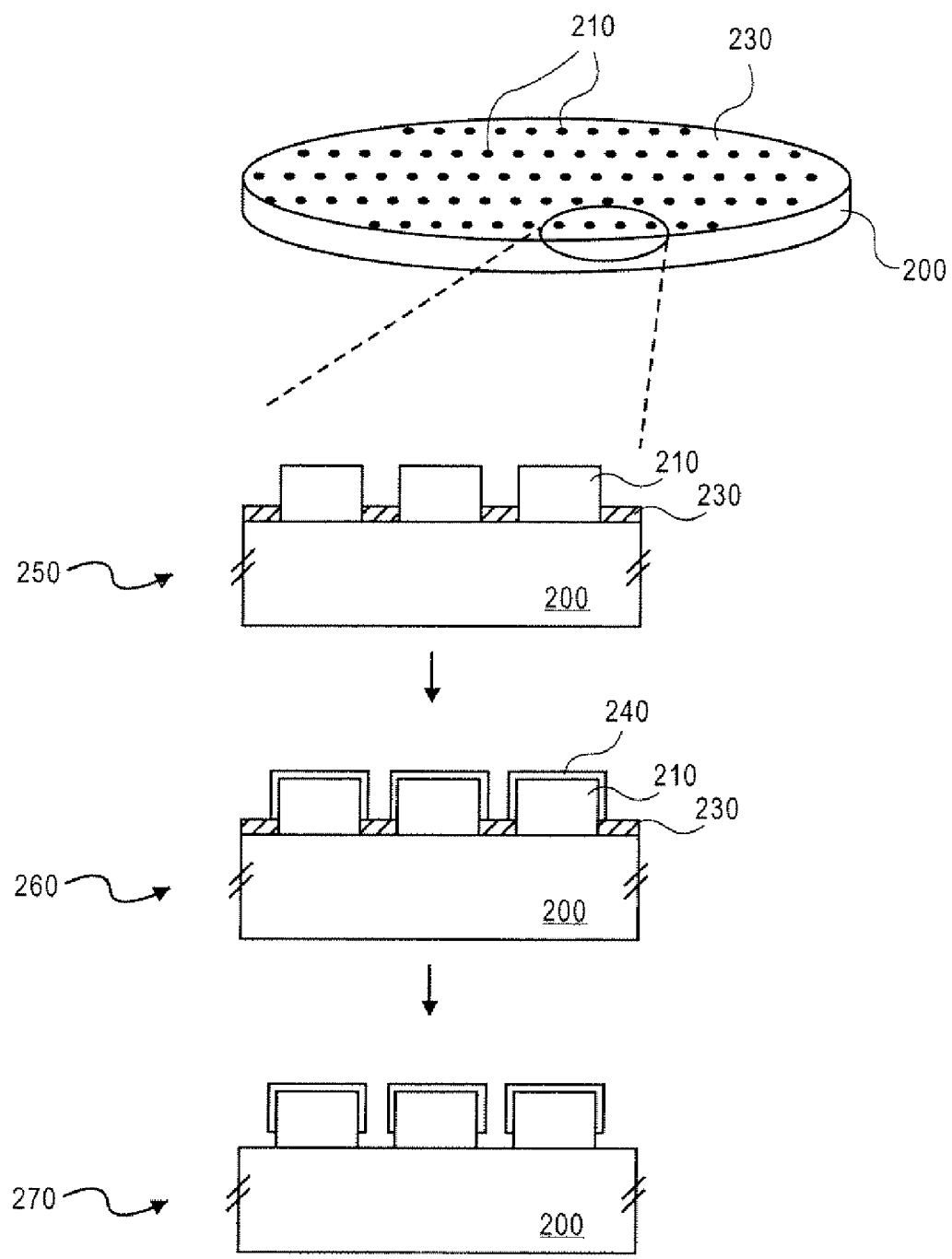
FIGS. 2a-2f illustrate a method of forming a flip chip package including forming an metal alloy barrier layer of an embodiment of the present invention over the copper bumps of the die.

Described herein are methods of forming metal alloy group VIII-based diffusion barriers over copper. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

The diffusion of elements through barrier layers formed of group VIII metals, and in particular the diffusion of copper through these barrier layers, may be eliminated by increasing the alloy qualities of the barrier layer. The group VII metals include cobalt, nickel, iron, ruthenium, rhodium, palladium, osmium and iridium. Metal alloy barrier layers formed of a group VII metal alloyed with boron (B) and/or phosphorous (P) and an at least one element from glyoxylic acid, such as carbon (C), hydrogen (H), or carbon and hydrogen (CH) by electroless plating prevent more copper diffusion than other barrier layers without this combination of elements. These metal alloy barrier layers also demonstrate greater stress resistance and thus do not become brittle and fall apart under the pressures of processing and use. Therefore, barrier layers formed of a metal alloy layer of a group VII metal alloyed with B and/or P and an at least one element from glyoxylic acid over a copper layer may be used to prevent the formation of intermetallic compounds between copper and tin when the barrier layer is formed over copper bumps that are soldered to a tin-based solder. Such metal alloy barrier layers may also be used as barrier layer liners within trenches in which copper interconnects or vias are formed and as capping layers over copper interconnects or vias to prevent the electromigration of copper.

A metal alloy barrier layer formed of a group VIII metal alloyed with boron (B) and/or phosphorous (P) and an at least one element from glyoxylic acid may be formed over a copper layer by an electroless plating process. Electroless plating is a process for depositing a layer of material onto a surface by the chemical reduction of an electrolytic solution in the absence of an external electric current. The electroless deposition of the metal alloy barrier layer may result from the electrochemical reaction between the metal ions of the electrolytic solution and the reducing agents on the catalytic surface. Complexing agents and pH adjusters may also effect the deposition of the layer of material onto a surface. Other components within the electroless plating solution, such as the reducing agent, may contribute elements to the metal alloy barrier layer such as boron or phosphorous.

The electroless plating solution contains a group VIII metal containing compound, a reducing agent containing B and/or P, glyoxylic acid, a complexing agent, a buffer agent, and a pH adjuster. The solution may also include other additives such as a stabilizer. The group VIII metal containing compound is a compound where the group VIII metal is chemically bound to another type of element and where the group VIII metal may dissociate from the other element to become part of the electroless plating solution and be available to be plated onto the substrate along with B and/or P and an element from glycolic acid. The group VIII containing compound may be a chloride, a sulfate or an acetate combined with the group VII metal. In one particular embodiment, the group VIII metal may be cobalt and the cobalt-containing compound may be $CoCl_2 \cdot 6H_2O$, cobalt sulfate, or cobalt acetate. In an embodiment where $CoCl_2 \cdot 6H_2O$ is the cobalt containing compound in the solution, the amount of $CoCl_2 \cdot 6H_2O$ may be in the approximate range of 5 g/L and 40 g/L and more particularly in the approximate range of 8 g/L and 28 g/L. In another embodiment the group VIII metal may be nickel. The reducing agent containing B may be an amino borane such as dimethylaminoborane (DMAB) or trimethylaminoborane (TMAB). The reducing agent containing P may be a hypophosphite such as ammonium hypophosphite or sodium hypophosphite. These reducing agents contribute B and/or P to the metal alloy being plated, but also serve the purpose of assuring the continued deposition of the metal alloy barrier layer as the surface of the copper layer changes from the original copper to the metal alloy barrier layer. Although the initial deposition of the metal alloy barrier layer 240 may be autocatalytic, the changing chemical environment of the substrate surface may interrupt the autocatalytic environment. Therefore, a reducing agent may be provided to assure continued deposition of the metal alloy barrier layer. The amount of the reducing agent added to the electroless plating solution may be an amount sufficient to provide B and/or P to the metal alloy barrier layer as well as function as a reducing agent and ensure the continued deposition of the metal alloy barrier layer. In an embodiment where DMAB is the reducing agent, the amount of DMAB in the electroless plating solution may be in the approximate range of 5 g/L to 22 g/L and more particularly in the approximate range of 2 g/L to 30 g/L.

Glyoxylic acid is part of the electroless plating solution because it contributes an element to the metal alloy barrier layer. Glyoxylic acid may be present in the electroless plating solution in an amount in the approximate range of 1 g/L to 20 g/L and more particularly in the approximate range of 1 g/L and 10 g/L. The element or elements that glyoxylic acid contributes to the plating solution may be carbon (C), hydrogen (H), or carbon and hydrogen (CH). The elements that glyoxylic acid contributes to the metal alloy barrier layer significantly increase the ability of the amorphous alloy barrier layer to prevent the diffusion of atoms such as copper, tin, or oxygen through the barrier layer. Also, the shear strength of the metal alloy barrier layer may also be increased meaning that the metal alloy barrier layer may sustain greater amounts of stress and pressure before breaking down. Because the metal alloy barrier layer may sustain greater amounts of stress before breaking down it may remain effective as a barrier layer to the diffusion of atoms for much longer than other barrier layers.

The electroless plating solution also may contain a complexing agent. The complexing agent may be a carboxylic acid, or a derivative of carboxylic acid, such as citric acid, malonic acid, lactic acid, or oxalic acid, or the complexing agent may be an amine such as ethylenediamine (EDA) or ethylenediaminetetraacetic acid (EDTA). The complexing agent may serve to complex to the metals in the electroless plating solution to prevent the precipitation of the metals out of the electroless plating solution. The electroless plating solution may contain an amount of the complexing agent that is sufficient to prevent the precipitation of the metals out of the electroless plating solution. In the embodiment where citric acid is the complexing agent the amount of citric acid in the electroless plating solution may be in the approximate range of 20 g/L to 60 g/L and more particularly in the approximate range of 25 g/L to 45 g/L.

A buffer may also be included in the electroless plating solution to maintain the pH within a particular range. The buffer may be ammonium chloride, $NH_4Cl$. The amount of $NH_4Cl$ in the electroless plating solution may be in the approximate range of 10 g/L and 40 g/L and more particularly approximately 15 g/L to 25 g/L. The buffer may be any compound compatible with the electroless plating solution that can help maintain the pH of the solution in the approximate range of 8.6 and 10.5, and more particularly in the approximate range of 9.0 and 9.5. The pH may also be maintained within a target range by adding a pH adjustor to adjust the pH as needed. The pH adjustor may be a basic compound such as tetramethylammonium hydroxide (TMAH), potassium hydroxide (KOH), or dimethylamine (DMA). The pH may be affected by any or all of the components of the electroless plating solution and is therefore hard to predict even with the addition of a buffer. The pH adjuster may therefore be used to adjust the pH to the target pH. The electroless plating solution may also contain a stabilizer such as thiodiglycolic acid. The amount of stabilizer may vary depending on the amount needed to optimize the electroless plating solution.

The components of the electroless plating solution may be combined in a solvent or in a combination of solvents. Solvents that may be used include water and ethylene glycol. The amount of solvent used is based on how much solvent is needed to solvate the components of the electroless plating solution and how large of a volume of the electroless plating solution is required. In a typical example, the amount of solvent used is 1 liter and the chemical concentrations are normalized to 1 liter of solvent (chemicals volume+solvent=1 liter.) It is to be understood that the compounds within the electroless plating solution may dissociate and recombine within the solvent to form different compounds.

In one particular embodiment, the composition of an electroless plating solution to plate a metal alloy barrier layer formed of cobalt, boron, and an element from glyoxylic acid may be a combination of $CoCl_2 \cdot 6H_2O$ to contribute cobalt to the plated alloy, glyoxylic acid to serve as a reducing agent and to contribute an element to the plated alloy, citric acid (monohydrate) as a complexing agent, $NH_4Cl$ as a buffer agent, dimethylamine (40% solution) as a pH adjustor, dimethylaminoborane (DMAB) as a reducing agent and to contribute boron to the plated alloy, thiodiglycolic acid as a stabilizer, and water to solvate the components of the electroless plating composition. The composition may also include any reaction products of the components in the solution. The amount of $CoCl_2 \cdot 6H_2O$ in the solution may be in the approximate range of 5 g/L and 40 g/L and more particularly in the approximate range of 8 g/L and 28 g/L. The amount of glyoxylic acid in the solution may be in the approximate range of 1 g/L to 20 g/L and more particularly in the approximate range of 1 g/L and 10 g/L. The amount of citric acid in the solution may be in the approximate range of 20 g/L to 60 g/L and more particularly in the approximate range of 25 g/L to 45 g/L. The amount of $NH_4Cl$ in the solution may be in the approximate range of 10 g/L and 40 g/L and more particularly approximately 15 g/L to 25 g/L. The amount of dimethylamine (40% solution) in the solution depends on the amount required to adjust the pH to be in the approximate range of 8.6 and 10.5, and more particularly in the approximate range of 9.0 and 9.5. The amount of dimethylaminoborane (DMAB) in the solution may be in the approximate range of 5 g/L to 22 g/L and more particularly in the approximate range of 2 g/L to 30 g/L. The amount of thiodiglycolic acid varies depending on the amount needed to optimize the electroless plating solution, and may initially be approximately 10 ppm of the solution before optimization. An amount of water sufficient to solvate the solution is used. The temperature of the electroless plating solution may be in the approximate range of 30° C. and 90° C., and more particularly in the approximate range of 50° C. and 53° C.

In one embodiment, a metal alloy barrier layer formed of a group VIII metal alloyed with boron (B) and/or phosphorous (P) and an at least one element from glyoxylic acid may be formed over the copper bumps of a wafer having integrated circuitry. In this embodiment, the barrier layer serves to prevent the formation of intermetallic compounds composed of copper and tin, where the tin comes from the tin-based solder bumps that are used to couple the dies cut from the wafer having integrated circuitry to a package carrier. FIG. 1 illustrates a flow chart outlining the process of forming a package for a microelectronic device that includes the metal alloy barrier over the copper bumps. At block 101, tin-based solder bumps are formed on a package carrier. The package carrier may be either a substrate or a leadframe and will provide the connection from the die to the exterior of the package. In this particular embodiment, the package carrier is a package substrate. The tin-based solder is typically applied to the bond pads of the package substrate on the top surface of the package substrate. After the solder is applied, the package substrate is heated to beyond the tin-based solder's melting point to re-flow the solder, as indicated in block 102, to facilitate complete wetting of the solder to the bond pads. At block 103, a wafer 200 with copper bumps 210 surrounded by a material to protect the underlying circuitry of the wafer 200 is provided. The wafer 200 is formed with a plurality of copper bumps 210. The copper bumps 210 are surrounded by a material, such as a photoresist material 230, to protect the underlying circuitry of the wafer 200 and to prevent the deposition of the metal alloy barrier layer 240 onto the region surrounding the copper bumps 210. Because the electroless plating process catalytically occurs on metal, the polymeric photoresist material 230 is not plated. Expanded views of a portion of the wafer 200 are illustrated in FIG. 2a at 250, 260, and 270. At 250 the copper bumps 210 formed on the wafer 200 and surrounded by the photoresist material 230 are illustrated. The top surface of the wafer 200 that includes the copper bumps 210 is then exposed to an electroless plating solution, such as the electroless plating solutions described above, to form the metal alloy barrier layer 240 at block 104. The metal alloy barrier layer 240 is a layer formed of a group VIII metal, such as cobalt (Co) or nickel (Ni), alloyed with boron (B) and/or phosphorous (P) and at least one element from glyoxylic acid. In one embodiment the metal alloy barrier layer 240 may be cobalt, boron, and at least one element from glyoxylic acid. The copper bumps 210 may be plated with the metal alloy barrier layer 240 by immersing the entire wafer 200 into an electroless plating bath or by only immersing the topside of the wafer 200 that includes the copper bumps 210 into the electroless plating solution. Alternatively, the electroless plating solution may be sprayed onto the topside of the wafer 200 to plate the copper bumps 210 with the metal alloy barrier layer 240. To immerse or expose only the topside of the wafer 200 containing the copper bumps 210 the backside of the wafer 200 may be contained or covered with a protective seal or by exposing only the topside of the wafer 200 to the electroless plating solution.

The wafer 200 may be exposed to the electroless plating solution for a time sufficient to form the metal alloy barrier layer 240 to a thickness in the approximate range of 0.1 µm and 10 µm (micrometers) and more particularly in the approximate range of 2 µm and 3 µm. The deposition time depends on several factors such as the amount and strength of reducing agent in the electroless plating solution as well as the temperature of the plating solution. The deposition rate may be increased by a stronger reducing agent, an increased amount of reducing agent, and the temperature of the electroless plating solution. In an embodiment where the electroless plating solution contains approximately 8 g/L to 28 g/L of $CoCl_2 \cdot 6H_2O$, approximately 1 g/L to 10 g/L glyoxylic acid, approximately 25 g/L to 45 g/L citric acid (monohydrate), approximately 15 g/L to 25 g/L $NH_4Cl$, an amount of dimethylamine (40% solution) sufficient to adjust the pH to be in the approximate range of 9.0 and 9.5, approximately 5 g/L to 22 g/L dimethylaminoborane (DMAB), approximately 10 ppm thiodiglycolic acid, and water to solvate the components of the electroless plating composition where the electroless plating solution has a temperature in the approximate range of 50° C. and 53° C., the plating rate may be approximately 0.025 µm/minute. At this rate, to plate a metal alloy barrier layer 240 having a thickness of 3 µm would take approximately 2 hours. The time to plate the metal alloy barrier layer 240 varies depending on the factors described above and on how thick of a layer is to be plated. The metal alloy barrier layer 240 formed over the copper bumps is illustrated at 260.

Figure 2B:
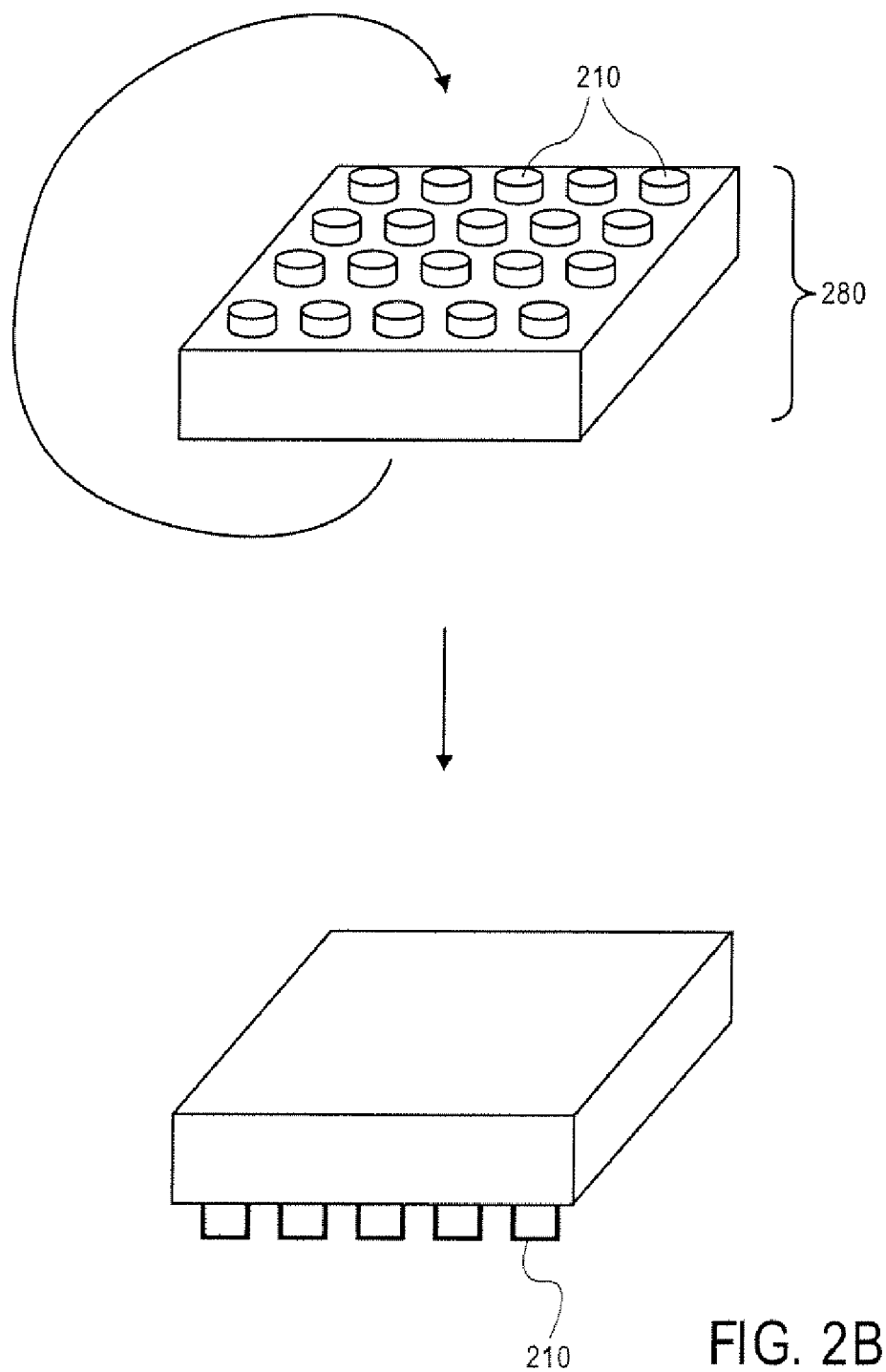
Figure 2C:
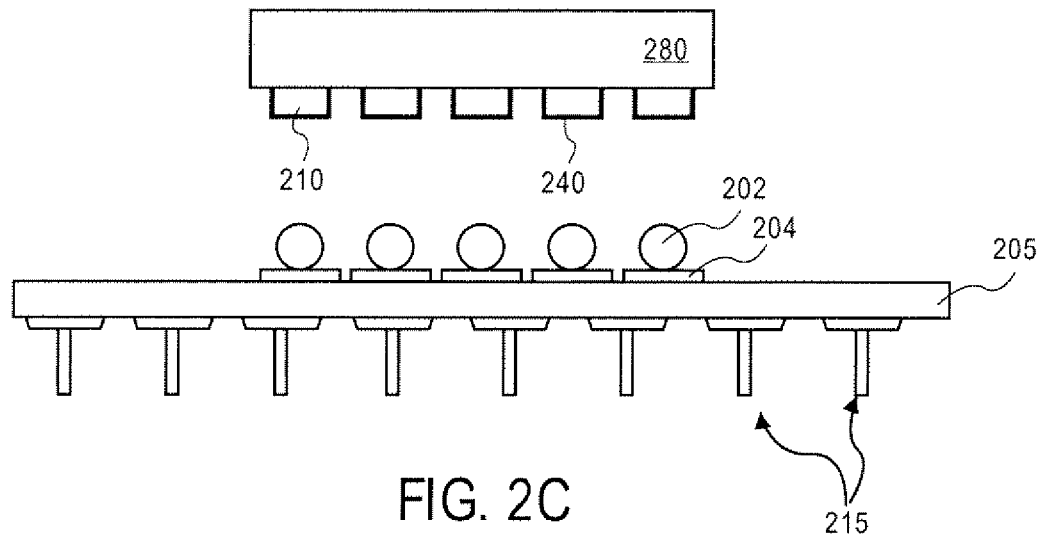
Figure 2D:
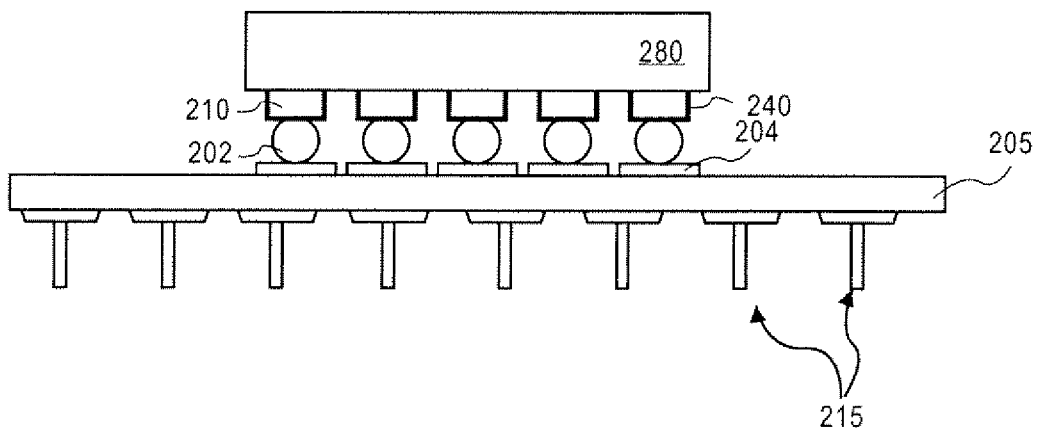
Figure 2E:
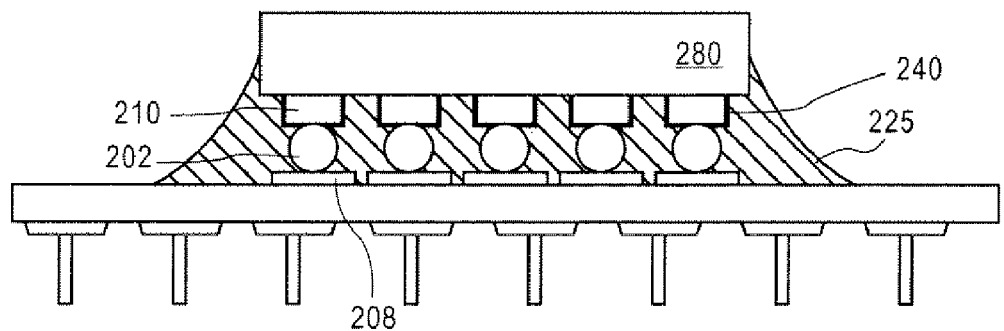
Figure 2F:
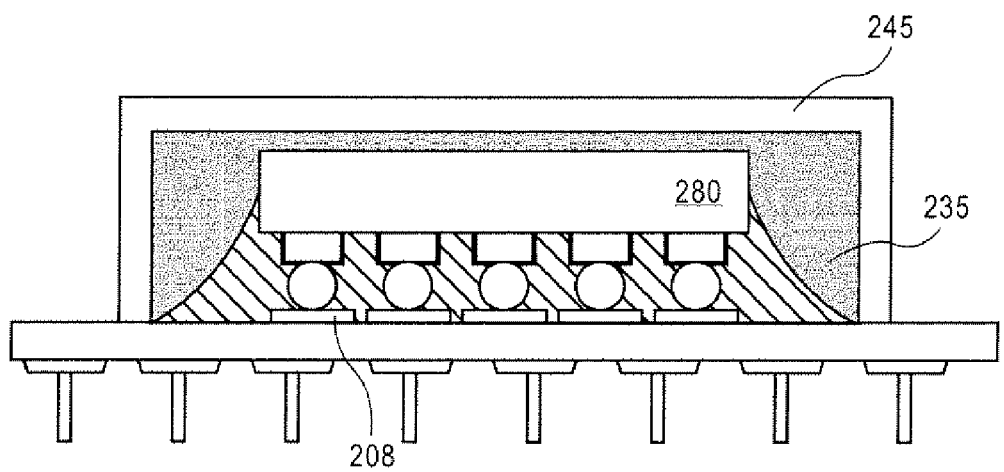

At block 105, and illustrated at 270 in FIG. 2a, the material used to protect the underlying circuitry is removed. To remove the photoresist 230 a developer solution may be applied to the polymeric photoresist 230 to make the photoresist 230 soluble in a solvent so that the photoresist may be removed. At block 106 of FIG. 1 the wafer 200 is cut into dies such as the die 280 illustrated in FIG. 2b. In a flip-chip packaging method the die is "flipped", as illustrated in FIG. 2b, to face downwards in the direction of the upwards facing tin-based solder bumps on a package carrier to which the copper bumps are to be attached. At block 107 of FIG. 1 the copper bumps 210 of the die 280 are aligned with the tin-based solder bumps 202 on the pads 204 of the package substrate 205 illustrated in FIG. 2c. The package substrate 205 may be, for example, a pin grid array (PGA) as illustrated or a ball grid array (BGA.) In the embodiment illustrated in FIGS. 2c-2f the package substrate 205 is a pin grid array with pins 215. To align the die 280 with the tin-based solder bumps 202 on the package substrate 205, the die 280 may be picked up by the head of a thermo-compression bonder. The thermo-compression bonder is a device often used in chip packaging operations that has the capability to provide pressure to the die 280 and the package substrate 205 to hold the tin-based solder bumps 202 in alignment with the copper bumps 210 and in contact with the metal alloy barrier layer 240 on the copper bumps 210, as illustrated at FIG. 2d. The amount of pressure applied by the thermo-compression bonder depends on the dimensions of the die and the number of flip chip connections to be made. The tin-based solder bumps 202 are then reflowed at block 108. The tin-based solder bumps 202 are reflowed by heating the tin-based solder bumps 202 to above the melting point of the tin-based solder bumps 202. The tin-based solder bumps 202 may be heated by a pulse heat tool. The heated tin-based solder bumps 202 are wetted to the metal alloy barrier layer 240 that is formed over the copper bumps 210. Once cooled, the tin-based solder bumps 202 become attached to the metal alloy barrier layer 240 through a metallic bond as illustrated in FIG. 2e. The gap between the die 280 and the package substrate 215 may then be filled with an underfill material such as an epoxy resin 225 at block 109 of FIG. 1 to increase the longevity, environmental resistance, and fatigue strength of the interconnects as illustrated in FIG. 2f. A thermal interface material 235 and a heat sink 245 are then formed over the die 280 at block 110 and as illustrated at FIG. 2f. The metal alloy barrier layer 240 may increase the lifetime and performance of the microelectronic device formed on the die 280. This is because the metal alloy barrier layer 240 prevents the formation of copper and tin intermetallic compounds and because it remains ductile and resists breakdown due to the conditions exerted on the package during use of the microelectronic device.

Metal alloy barrier layers may also be used as barrier layers around copper interconnect lines to prevent the electromigration of copper into the surrounding dielectric materials. The electromigration of copper occurs when current is applied to copper and can cause shorts and eventually device failure. Copper also migrates into the dielectric materials surrounding the copper interconnect lines due to thermal expansion, oftentimes forming hillocks that can cause shorts within the device. Metal alloy barrier layers may prevent electromigration and hillock formation. Therefore, the metal alloy barrier layers formed of a group VIII metal, such as cobalt (Co) or nickel (Ni), alloyed with boron (B) and/or phosphorous (P) and at least one element from glyoxylic acid may be effective as barrier layers within a trench or via for interconnect lines or as capping layers formed over the interconnect lines.

Figure 3:
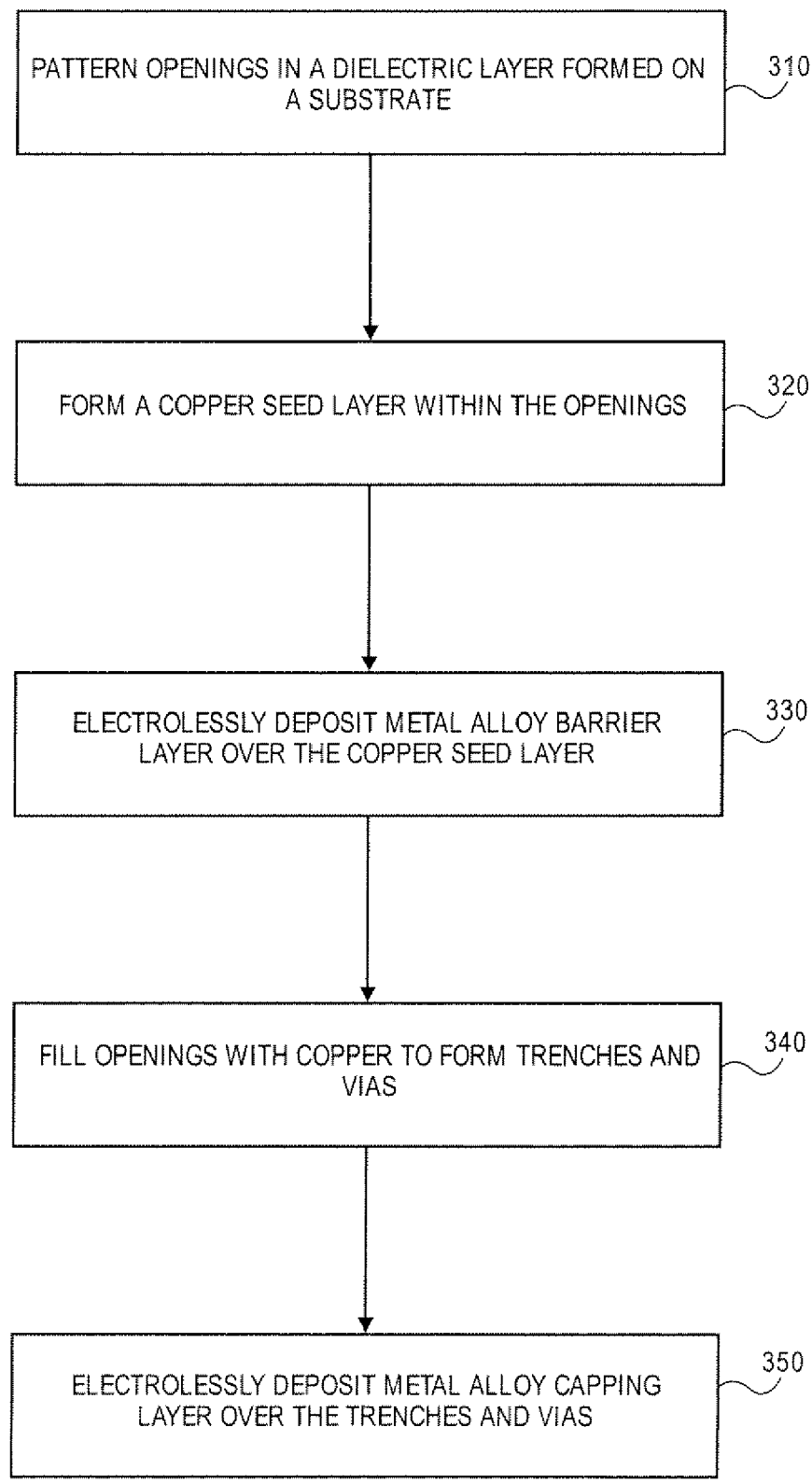
FIG. 3 is a flow chart of an exemplary method of forming barrier layers and capping layers formed of the metal alloy barrier layer of an embodiment of the present invention in a dual damascene method.
Figure 4A:
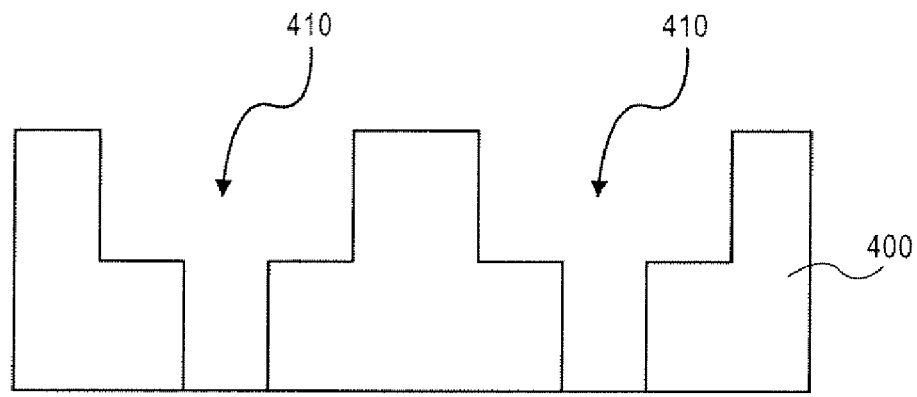
FIGS. 4a-4f illustrate a method of forming one interconnect layer in a dual damascene process incorporating the formation of barrier layers and capping layers formed of the metal alloy barrier layer of an embodiment of the present invention.

FIG. 3 is a flow chart that outlines forming a barrier layer and a capping layer formed of the metal alloy material in a dual damascene process. At block 310, openings are patterned into a dielectric layer 400 formed on a substrate, as illustrated in FIG. 4a. The dielectric layer 400 may be an inorganic material such as silicon dioxide or carbon doped oxide (CDO) or a polymeric low dielectric constant material such as poly(norbornene) such as those sold under the tradename UNITY™, distributed by Promerus, LLC; polyarylene-based dielectrics such as those sold under the tradenames "SiLK™" and "GX-3™", distributed by Dow Chemical Corporation and Honeywell Corporation, respectively; and poly(aryl ether)-based materials such as that sold under the tradename "FLARE™", distributed by Honeywell Corporation. The dielectric layer 400 may have a thickness in the approximate range of 2,000 and 20,000 angstroms.

Figure 4B:
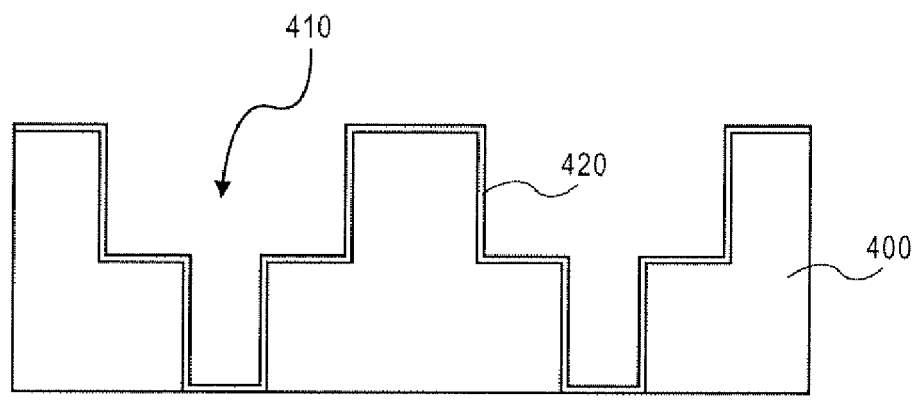
Figure 4C:
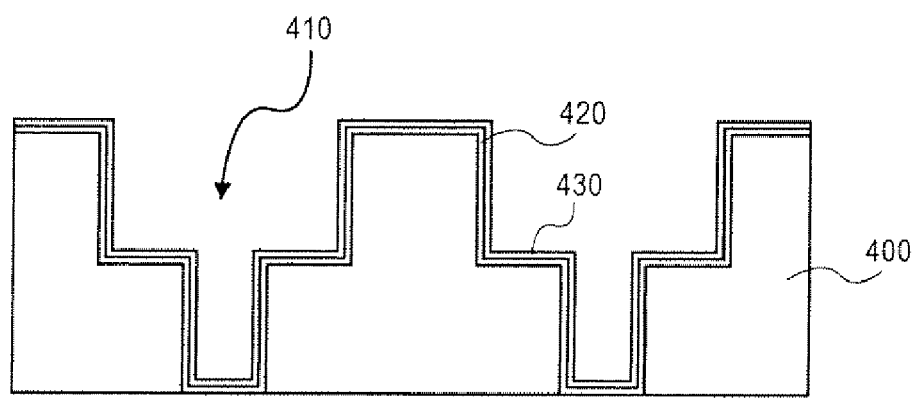

The openings 410 may be patterned by a dual damascene process to form both the vias and the interconnect openings. FIG. 4b illustrates a seed layer 420 formed of copper on a barrier layer (not shown) such as Ta/TaN (or WN, TiN, WSiN, WCN, TiSiN, etc.), or other seed metals (Co, Ni, etc.) which do not require a barrier layer to prevent significant diffusion to the ILD. The seed layer 420 may be electrolessly plated and formed over the openings 410 in the dielectric layer 400 at block 320 of FIG. 3. The seed layer 420 may also be deposited by chemical vapor deposition (CVD), physical vapor deposition (PVD), or by atomic layer deposition (ALD). The amorphous alloy material 430 may then be formed over the seed layer 420 by electroless deposition at block 330 of FIG. 3. The substrate on which the dielectric layer 400 is formed may be immersed in the electroless plating bath or the electroless plating solution may be sprayed on the dielectric. The seed layer 420 may be exposed to the electroless plating solution for a time sufficient to form the amorphous alloy layer 430 to have a thickness in the approximate range of 100 Å and 600 Å and more particularly in the approximate range of 200 Å and 300 Å. The deposition time depends on several factors such as the amount and strength of reducing agent in the electroless plating solution as well as the temperature of the plating solution. The stronger the reducing agent and the more reducing agent present in the electroless plating solution increase the deposition rate. Also, a higher temperature of the electroless plating solution increases the deposition rate. In an embodiment where the electroless plating solution contains approximately 8 g/L to 28 g/L of $CoCl_2 \cdot 6H_2O$, approximately 1 g/L to 10 g/L glyoxylic acid, approximately 25 g/L to 45 g/L citric acid (monohydrate), approximately 15 g/L to 25 g/L $NH_4Cl$, an amount of dimethylamine (40% solution) sufficient to adjust the pH to be in the approximate range of 9.0 and 9.5, approximately 5 g/L to 22 g/L dimethylaminoborane (DMAB), approximately 10 ppm thiodiglycolic acid, and water to solvate the components of the electroless plating composition where the electroless plating solution has a temperature in the approximate range of 50° C. and 53° C., the plating rate may be approximately 250 Å/minute. At this rate, to plate a metal alloy barrier layer having a thickness of 500 Å would take approximately 2 minutes. The time to plate the metal alloy barrier layer varies depending on the factors described above and on how thick of a layer is to be plated. The metal alloy barrier layer 430 formed over the seed layer 420 is illustrated in FIG. 4c.

Figure 4D:
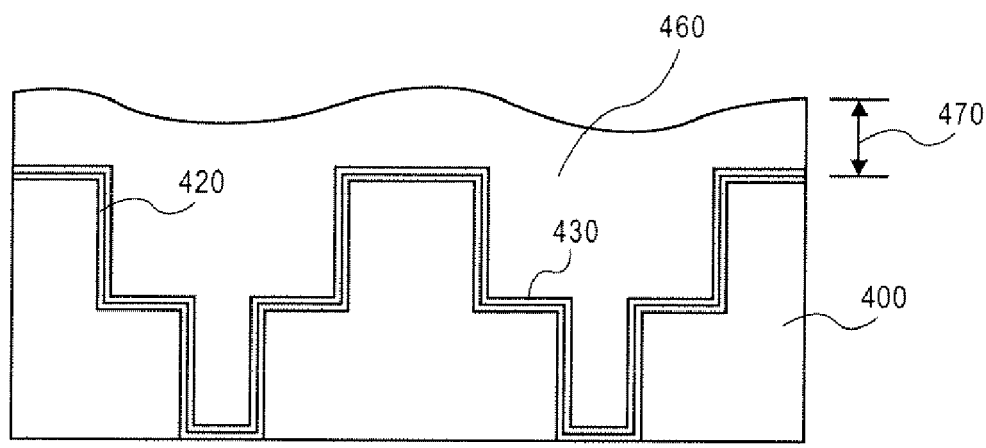
Figure 4E:
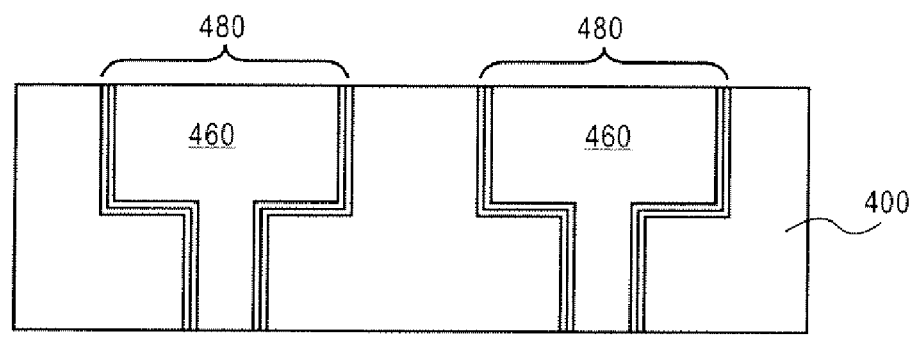
Figure 4F:
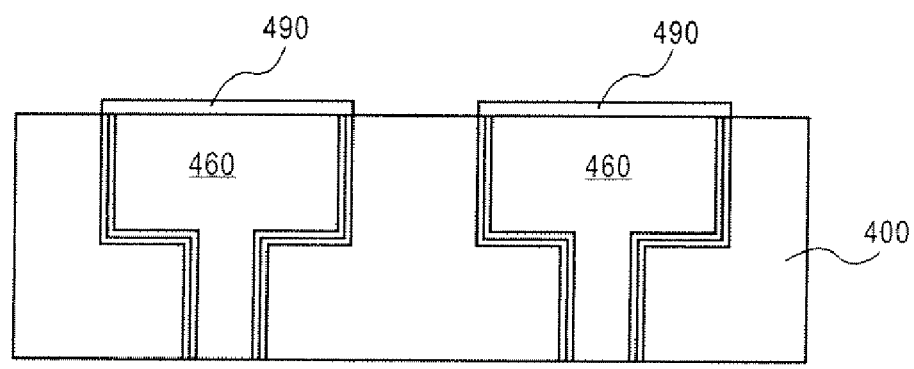

At block 340 of FIG. 3, a copper layer 470 is then deposited over the metal alloy barrier layer 430 by electroplating or by electroless deposition as illustrated in FIG. 4d. The excess copper material 470 that is above the dielectric material 400 is then removed by chemical mechanical polishing (CMP) as illustrated at FIG. 4e. An metal alloy capping layer 490 may then be formed over the copper material 460 at the copper interfaces 480 within the dual damascene trench and via openings at block 350 of FIG. 3. The metal alloy capping layer 490 is illustrated in FIG. 4f and may be formed by electroless deposition in the same manner that the metal alloy barrier layer 430 was formed within the openings 410, as described above. The metal alloy capping layer 490 may be formed to a thickness in the approximate range of 10 Å and 1000 Å and more particularly in the approximate range of 200 Å and 300 Å. Additional conductive and insulating layers may be formed above the dielectric 400 and the capping layers 490 until the desired integrated circuit is produced.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A method, comprising:
   forming a copper layer over a substrate; and
   forming over the copper layer a metal alloy layer comprising a group VIII metal alloyed with B and/or P and at least one of the following elements from glyoxylic acid:
   carbon (C);
   hydrogen (H).

2. The method of claim 1, wherein forming the metal alloy layer over the copper layer comprises forming the metal alloy layer by electroless deposition over the copper layer.

3. The method of claim 2, wherein forming the metal alloy layer by electroless deposition over the copper layer comprises exposing the copper layer to an electroless plating solution comprising a compound containing the group VIII metal, a reducing agent containing B and/or P, glyoxylic acid, a complexing agent, a buffer agent, and a pH adjuster.

4. The method of claim 1, wherein forming the copper layer over the substrate comprises forming copper bumps over a semiconductor wafer having integrated circuitry.

5. The method of claim 1, wherein forming the copper layer over the substrate comprises forming a trench or a via within a dielectric layer.

6. The method of claim 5, wherein forming the metal alloy layer over the copper layer comprises forming a capping layer over the trench or via.

7. The method of claim 1, wherein forming the copper layer over the substrate comprises forming a seed layer within an opening within a dielectric layer.

8. The method of claim 7, wherein forming the metal alloy layer over the copper layer comprises forming a barrier layer over the seed layer.

9. A method, comprising:
   forming a plurality of copper bumps over a wafer;
   forming, over the copper bumps by electroless deposition, a metal alloy barrier layer comprising cobalt alloyed with boron and an at least one of the following elements from glyoxylic acid:
   carbon (C);
   hydrogen (H); and,
   soldering a plurality of solder bumps to the barrier layer formed over the copper bumps in a flip-chip process.

10. The method of claim 9, wherein forming the metal alloy barrier layer over the copper bumps by electroless deposition comprises forming the barrier layer selectively on only the copper bumps and not on the substrate surrounding the copper bumps.

11. The method of claim 9, wherein forming the metal alloy barrier layer over the copper bumps by electroless deposition comprises exposing the copper bumps to an electroless plating solution comprising $CoCl_2 \cdot 6H_2O$, dimethylaminoborane (DMAB), glyoxylic acid, citric acid, $NH_4Cl$, and dimethylamine (DMA).

12. The method of claim 9, wherein forming the metal alloy barrier layer over the copper bumps by electroless deposition comprises exposing the copper bumps to an electroless plating solution for a time sufficient to form a barrier layer having a thickness of approximately 2 µm.

13. The method of claim 9, wherein soldering the plurality of solder bumps on a substrate to the barrier layer formed over the copper bumps comprises soldering the plurality of solder bumps comprising a tin-based solder to the metal alloy barrier layer formed over the copper bumps.

14. A method, comprising:
   forming a metal alloy barrier layer over a plurality of copper bumps formed over a substrate having integrated circuitry; and
   coupling the plurality of copper bumps to a plurality of tin-based solder bumps formed on a package carrier, wherein the metal alloy barrier layer prevents the diffusion of copper from the copper bumps or tin from the tin-based solder bumps after the plurality of copper bumps are soldered to the plurality of tin-based solder bumps.

15. The method of claim 14, wherein coupling the plurality of the copper bumps to the plurality of tin-based solder bumps comprises aligning the copper bumps with the tin-based solder and reflowing the tin-based solder.

16. The method of claim 14, wherein the metal alloy barrier layer is an alloy of cobalt, boron, and at least one of the following elements from glyoxylic acids:
   carbon (C);
   hydrogen (H).

17. A method, comprising:
   forming a copper diffusion barrier layer over copper with an electroless plating process, said copper diffusion barrier layer comprising an alloy of a Group VIII metal and boron (B) and/or phosphorous (P), said electroless plating process comprising preparing an electroless plating solution comprising:
   a) a compound having a metal selected from the group consisting of:
      (i) cobalt;
      (ii) nickel;
      (iii) iron;
      (iv) ruthenium;
      (v) rhodium;
      (vi) palladium;
      (vii) osmium; and,
      (viii) iridium;
   b) a reducing agent, said reducing agent comprising B and/or P; and,
   c) glyoxylic acid
   wherein said electroless plating process further comprises material from said glyoxylic acid becoming part of said copper diffusion barrier layer.

18. The method of claim 17 wherein said compound is a chloride.

19. The method of claim 17 wherein said compound is a sulfate.

20. The method of claim 17 wherein said compound is an acetate.

21. The method of claim 17 wherein said metal is cobalt and said compound is one of:
   $CoCl_2 6H_2O$;
   cobalt sulfate;
   cobalt acetate.

22. The method of claim 21 wherein the said compound is $CoCl_2 6H_2O$ and the amount of said compound within said solution is within the range of 5 g/L and 40 g/L inclusive.

23. The method of claim 17 wherein said metal is nickel and said reducing agent is one of:
   dimethylaminoborane;
   trimethylaminoborane;
   ammonium hypophosphite;
   sodium hypophosphite.

24. The method of claim 23 wherein said reducing agent is trimethylaminoborane and the amount of said compound within said solution is within the range of 2 g/L and 30 g/L inclusive.

25. The method of claim 17 wherein the amount of said glyoxylic acid within said solution is within the range of 1 g/L and 10 g/L inclusive.

26. The method of claim 17 wherein said material includes at least one of:
 a) carbon (C);
 b) hydrogen (H).

27. The method of claim 26 wherein said solution also comprises:
 a) a complexing agent;
 b) a buffer agent;
 c) a pH adjuster.

28. The method of claim 17 wherein electroless plating process further comprises combining said solution with a solvent.

29. The method of claim 17 wherein said metal is selected from the group consisting of:
 (i) cobolt;
 (ii) nickel.

30. The method of claim 29 wherein said material includes at least one of:
 a) carbon (C);
 b) hydrogen (H).

31. The method of claim 29 wherein said solution also comprises:
 a) a complexing agent;
 b) a buffer agent;
 c) a pH adjuster.

32. The method of claim 29 wherein electroless plating process further comprises combining said solution with a solvent.

33. The method of claim 17 wherein said copper is a copper bump on integrated circuit die.

34. The method of claim 33 further comprising soldering said barrier layer to a package carrier.

35. A method, comprising:
 forming a copper diffusion barrier layer over copper with an electroless plating process, said copper diffusion barrier layer comprising an alloy of a Group VIII metal and boron (B) and/or phosphorous (P), said electroless plating process comprising chemically reacting:
 a) a compound containing a Group VIII metal;
 b) a reducing agent comprising boron (B) and/or phosphorous (P); and,
 c) glyyoxlic acid;
 wherein said electroless plating process comprises integrating material from said glyoxylic acid into said copper diffusion barrier layer while said copper diffusion barrier layer is being formed so that said copper diffusion barrier layer contains said material.

36. The method of claim 35 wherein said metal is selected from the group consisting of:
 (i) cobolt;
 (ii) nickel.

37. The method of claim 36 wherein said material includes at least one of:
 a) carbon (C);
 b) hydrogen (H).

38. The method of claim 35 wherein said copper is a copper bump on integrated circuit die.

39. The method of claim 38 further comprising soldering said barrier layer to a package carrier.

40. The method of claim 35 wherein said compound is a chloride.

41. The method of claim 35 wherein said compound is a sulfate.

42. The method of claim 35 wherein said compound is an acetate.

43. The method of claim 35 wherein said metal is cobalt and said compound is one of:
 $CoCl_2 6H_2O$;
 cobalt sulfate;
 cobalt acetate.

* * * * *